United States Patent [19]

Mize

[11] 3,821,773

[45] June 28, 1974

[54] SOLID STATE EMITTING DEVICE AND METHOD OF PRODUCING THE SAME

[75] Inventor: John L. Mize, Dayton, Ohio

[73] Assignee: Beta Industries, Inc., Dayton, Ohio

[22] Filed: Jan. 24, 1972

[21] Appl. No.: 220,064

[52] U.S. Cl. .................... 357/16, 357/2, 357/28, 357/61

[51] Int. Cl. .................... H01l 5/00

[58] Field of Search... 317/235 UA, 235 AC, 234 S, 317/234 Q, 235 N, 234 V, 235 R, 234 R, 235 AJ, 234 T, 235 A

[56] References Cited

UNITED STATES PATENTS

| | | | |
|---|---|---|---|
| 3,163,562 | 12/1964 | Ross | 148/33.4 |
| 3,503,124 | 3/1970 | Wanlass | 29/571 |
| 3,535,598 | 10/1970 | Feist | 317/234 |
| 3,699,404 | 10/1972 | Simon | 317/235 R |

OTHER PUBLICATIONS

Electronics, March 16, 1970, pp. 78–79.

Stolte et al., Solid State Electronics, Vol. 12, Pergamon Press 1969, pp. 945–954.

Stiles et al., I.B.M. Tech. Discl. Bull., Vol. 11, No. 1, June 1968, p. 102.

Kajiyana et al., Japan J. Appl. Phys., 6(1967) pp. 905–906.

DeWitt, I.B.M. Tech. Discl. Bull., Vol. 9, No. 1, June 1966, p. 102.

*Primary Examiner*—Martin H. Edlow
*Attorney, Agent, or Firm*—Jacox & Meckstroth

[57] ABSTRACT

Charge carriers are emitted from the surface of a heterojunction region which is formed within the film-like body of a semiconductor material. The emitting region is defined by an interface which is generally semicircular in cross-section or has at least a substantial portion neither parallel nor perpendicular to the surface of the film-like body. The thickness of the film-like body is somewhat greater than the depth of the emitting region so that continuous uninterrupted and generally semi-cylindrical inner and outer depletion regions exist adjacent the interface. When a voltage is applied across the film-like body and hence across the emitting region, the depletion regions distort in a particular fashion and produce an electric field within the emitting region. Electrons crossing the interface are "heated" by this field to a degree permitting electron emission from the surface of the emitting region. The electron emission may be varied by altering the voltage applied across the junction.

13 Claims, 7 Drawing Figures

PATENTED JUN 28 1974

3,821,773

SOLID STATE EMITTING DEVICE AND METHOD OF PRODUCING THE SAME

BACKGROUND OF THE INVENTION

It is desirable for a low temperature solid state electron emitter to provide a long service life, to be of low cost construction, to be operable within a wide range of temperatures and to operate with relatively low applied voltages. It is further desirable for such an emitter to provide high beam currents, high current densities, high current and power efficiencies and also to be operable without requiring a high or good vacuum. In addition, the emitter should not require the use of any dangerous or poisonous materials.

Existing cold solid state electron emitters are generally of three basic types. These are the field emitter, the tunnel-type emitter, and the negative affinity emitter. Each of these emitters is lacking in providing one or more of the above desirable advantages. For example, the field emitters require a high voltage power source and a high vacuum. These emitters also have a short service life and provide low electron currents. The tunnel emitters and the negative affinity emitters have low efficiencies compared to the emitter of this invention and negative affinity emitters employ the element caesium which is a dangerous and difficult material to handle. Furthermore, all of these emitters are expensive to construct.

In recent years, experimental work on another form of cold solid state electron emitter has been conducted by M. I. Elinson et al in U.S.S.R. The results of this work are reported in a 1965 issue of a U.S.S.R. publication entitled Radiotekhn and Elektron (pages 1290–1296) and indicate that "hot electrons," i.e., electrons having an energy level above the bottom of the conduction band, are emitted from specially prepared high resistance regions in a film of tin oxide semiconductor material ($SnO_2$) when a voltage is applied across the high resistance region. This work further shows that electron emission from the high resistance region is distinguished by a high emission efficiency at low voltages when compared to existing types of cold cathode solid state emitters.

Subsequent experiments on electron emission from tin oxide films have been conducted by A. M. Soellner et al at the University of Arkansas under a research program supported by the Avco Corporation. Some of the results of these latter experiments are reported in the Feb. 1968 issue of the Journal of Applied Physics and confirm that when a voltage is applied across a tin oxide film located within a vacuum, a narrow high resistance region forms, sometimes adjacent the negative metal contact, and electrons are emitted from this region.

Other studies relating generally to cold solid state electron emitters are reported in the following publications:

1. Technical Report, Nov., 1969, Rome Air Development Center, Air Force Systems Command, Griffiss Air Force Base, New York (RADC-TR-69-342) "The Formation and Characteristics of a Broad-Area Semiconductor Field Emission Cathode" Cornell University.
2. Laser Focus, Jan., 1970, E. D. Savoya, J. J. Tietjen, et al.
3. F. L. Schoormeyer, C. R. young and J. M. Blasingame
   a. Technical Report AFAL-TR-68-113, Apr., 1968.
   b. Technical Report AFAL-TR-68-100, June, 1968.
   c. Journal of Applied Physics Vol. 34, (3) pp. 1791–1996 Feb. 15, 1968.
4. Solid-State Electronics, Pergamon Press (Great Britain) 1969, Vol. 12, pages 945–954, "The Shottky Barrier Cold Cathode."
5. Solid State Electronics, Vol. 12, 1969, pages 945–954 C. A. Stolte, J. Vilms and R. J. Archer.
6. Journal of Applied Physics, Vol. 36, No. 9, Sept. 1965, pages 2939–2943, M. K. Testerman et al, "Cold Election Sources for Mass Spectrometric Applications."
7. Solid-State Electronics, Pergamon Press (Great Britain) Vol. 7, 1964, pages 445–453, "The Transport of Hot electrons in $Al—Al_2O_3—Al$ Tunnel Cathodes."
8. Institute of Radio Engineering and Electronics, Apr. 1964, pages 1107–1113, M. I. Elinson et al., "The Theory of the 'No Contact' Type of Hot electron Emission from Semiconductors."

SUMMARY OF THE INVENTION

The present invention is directed to an improved low temperature solid state charge carrier emitter which provides all of the advantages mentioned above in addition to providing for controlling the emission of charge carriers into a vacuum, gas, liquid or solid material. Specifically, the emitter of the invention provides for the emission of electrons, as one form of charge carriers, from a particular form of junction in response to a voltage applied across the junction. The electron emitter of the present invention is adapted for emitting electrons both across a solid-vacuum barrier as is required in cold cathode displays, photo cathodes, RF amplifiers and oscillators and across a solid-solid barrier as is required in injection lasers, electron beam injection transistors and variable barrier thin film transistors.

For purposes of description, the structure and configuration of an electron emitter constructed in accordance with the invention are illustrated with this structure taking the form of a non-stoichiometric tin dioxide-tin monoxide heterojunction. However, it is to be understood that the invention relates to a charge carrier emitter and may be formed of other semiconductor materials according to the performance characteristics desired for the particular application.

In general, the embodiment herein disclosed includes a thin film-like body of tin dioxide which is applied to a substrate such as quartz or glass. An electron emitting region in the form of an elongated curvalinear or generally semicylindrical junction is formed within the upper surface portion of this tin dioxide body and consists of tin monoxide. The depth of the generally semicylindrical interface defining the junction between the tin dioxide and tin monoxide materials is approximately one-half the thickness of the film in the illustrated embodiment of the invention, with the portion of the film remaining below the interface defining a narrow throat region in a conduction path existing between two electrodes or contacts attached to the film material on opposite sides of the junction region. Semicylindrical inner and outer depletion regions exist within the tin dioxide and tin monoxide materials adjacent their interface. The electrodes or contacts on the film are positioned so that their respective depletion regions do not intersect with the outer depletion region in the tin dioxide material.

When a voltage is applied across the electrodes or contacts attached to the film-like body, the energy barriers associated with the depletion regions and the junction of the tin dioxide and tin monoxide materials shift to an asymmetric condition resulting in charge carrier flow across the junction and into and out of the tin monoxide emitting region. The application of voltage to the electrodes or contacts also modifies the shape of the depletion regions in the tin dioxide and tin monoxide materials adjacent the junction and creates an electric field internal to the tin monoxide emitting region. This internal electric field acts upon the electrons crossing the junction into the tin monoxide region and excites these electrons into a higher energy state. As a result of the generally semicircular configuration of the junction, these energetic or hot electrons have component of momentum that equals or exceeds the surface or interface barrier so that electrons are emitted from the surface of the tin monoxide material. A variation in the applied voltage produces a corresponding change in the internal electric field and a corresponding variation in the electron emission.

Other features and advantages of the electron emitter of the invention will be apparent from the following description, the accompanying drawing and the appended claims.

DESCRIPTION OF THE ILLUSTRATED EMBODIMENTS

Figure 1:
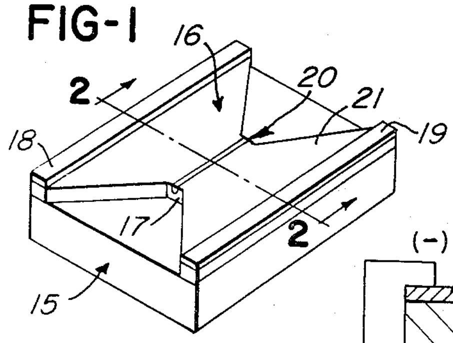
FIG. 1 is a perspective view of a low temperature solid state electron emitting device constructed in accordance with the invention and showing portions of the device greatly enlarged for purposes of illustration.

The solid state electron emitting device shown in FIG. 1 includes a supporting substrate 15 which may be a sheet of quartz or glass. A film-like body 16 of a wide band gap semiconductor material is deposited on the substrate 15 in an hourglass or bow tie configuration as shown generally in FIG. 1 to form a narrow constricted portion 17; this semiconductor material is a non-stoichiometric tin dioxide ($SnO_2$) which is an n-type semiconductor. As will be explained later, the body 16 may be constructed of other semiconducting materials and may also be formed in configurations other than that shown in FIG. 1. A pair of parallel-spaced contacts 18 and 19 extend along opposite edges of the body 16 and may be formed by depositing a film of gold on the semiconductor material of the body 16. While the two contact configuration of the device is illustrated in FIG. 1 for purposes of simplification, additional contacts may be used on the device.

Figure 2:
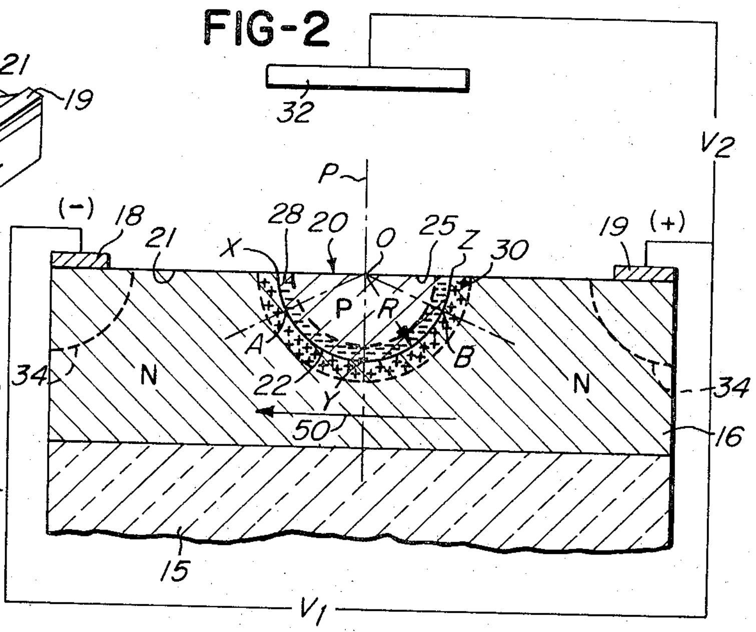
FIG. 2 is an enlarged cross-section of the electron emitting device shown in FIG. 1 as taken generally along the line 2—2 in FIG. 1 and illustrating its zero bias voltage condition.

An elongated electron emitting region 20 projects into the thickness of the body 16 from the upper surface 21 of the body and is formed of a narrow band gap semiconductor material consisting of tin monoxide (SnO) and the metal tin (Sn). The junction between the emitting region 20 and the body 16 define a heterojunction interface 22 which is generally semicircular in cross-sectional configuration and extends along the restricted portion 17 of the body 16 parallel to the contacts 18 and 19. In FIG. 2, the emitting region 20 is positioned midway between the contacts 18 and 19, but it may be located closer to one of the contacts 18 or 19 in other embodiments of the invention. While the emitting region 20 is shown in FIG. 1 to be precisely half-cylindrical and precisely defined as to horizontal dimensions, the region will usually be graded and only approximately half-cylindrical.

The semicylindrical configuration of the interface 22 assures that a substantial portion of the interface extends neither parallel nor perpendicular to a center reference plane P (FIG. 2) of the emitting region 20. Thus a plane tangent to the interface 22 at any point other than the points X, Y and Z, extends angularly or forms an obtuse angle with the reference plane P. This assures that the electric field generated internally in the emitting region 20 has components perpendicular to the emitting surface 25 which is illustrated in FIG. 2 as being flush and coplanar with the upper surface 21 of the body 16.

As illustrated in FIG. 2, a continuous semicylindrical negative inner depletion region 28 exists on the emitting region 20 side of the interface 22, and a continuous positive outer depletion region 30 exists on the film-like body side of the interface 22. These depletion regions 28 and 30 are of generally uniform width when the device is in a zero bias condition as shown in FIG. 2 and must contain equal and opposite amounts of electric charge.

Figure 4:
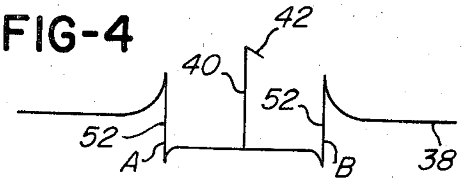
FIG. 4 is a conduction band energy diagram taken across the FIG. 2 electron emitting region along a particular path AB and before a voltage is applied to the device.

The energy band diagram of FIG. 4, is taken acorss the emitting region 20 along a path extending horizontally between the points A and B located on the interface 22; the abrupt change in the energy level at the points A and B in this diagram with reference to the bottom of the electron conduction band 38, results from the different band gaps of the materials forming the body 16 and the emitting region 20. The effects of surface and interface states which will modify the FIG. 4 idealized energy band diagram, are not considered.

As is apparent from FIG. 4, the energy level of the conduction band through the emitting region 20 inwardly of the inner depletion region 28 is substantially constant. The energy barrier at the surface 25 of the emitting region 20 is represented by a line 40. The short inclined line 42 at the top of the line 40, represents the vacuum energy level due to a voltage $V_2$ which may be applied to the collector 32 when the device of FIG. 2 is energized.

When a voltage is applied across the contacts 18 and 19 in FIG. 2 and hence across the emitting region 20 in the polarity shown in FIG. 2, a flow of current is produced in the conduction path 50 between the contacts 18 and 19. The IR drop resulting from this current flow causes each point on the body side of the interface 22 to be at a different electric potential. Most of the voltage drop along the conduction path 50 occurs in the body region immediately adjacent the outer depletion region 30 since this portion of the body has the highest resistance.

Figure 3:
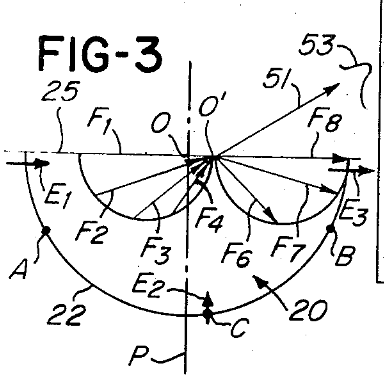
FIG. 3 is a cross-sectional view of the electron emitting region of the electron emitting device shown in FIG. 2 and showing a representation of the electrons flowing into the emitting region and the electric fields existing in the emitting region during operation of the device.

Even though each point on the body side of the interface 22 is at a different electric potential, it is necessary for any given point on the surface 25 of the emitting region to have an electrical potential which is single valued or has the same value regardless of the path used in reaching the point. For example, the potential at point O' in FIG. 3 must be the same regardless of whether the point O' is reached by starting at the point A or the point C, in FIG. 3. The potential along the path A–O in FIG. 3 is defined by the left hand portion of the FIG. 4 energy diagram, i.e., the portion up to the base of the line 40 while the potential along the path O-B in FIG. 3 is defined by the right hand portion of the FIG. 4 energy diagram, i.e., the portion to the right of the base of the line 40. The difference in the bottom of the conduction band energy level in the FIG. 4 and FIG. 6 drawings is the result of different potentials at the points A and B in FIG. 4 and results from the IR drop along the path 50 shown in FIG. 2.

Figure 5:
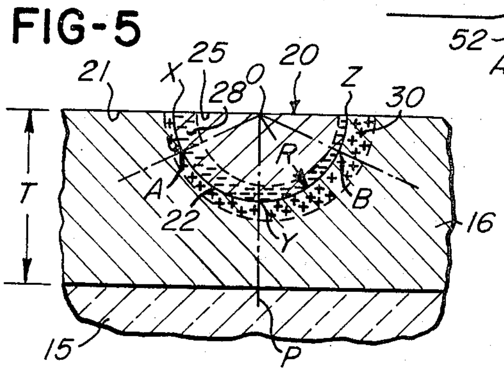
FIG. 5 is a fragmentary section similar to FIG. 2 and illustrating, in a greatly exaggerated form, the deformed depletion regions around the electron emitting region after a voltage is applied to the device.
Figure 6:
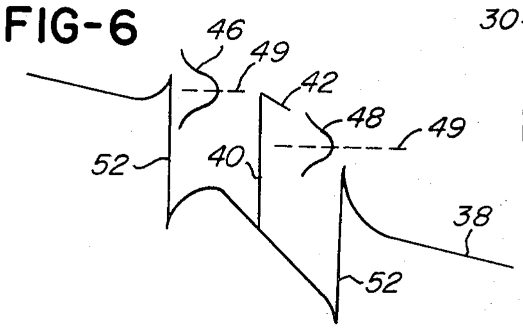
FIG. 6 is a conduction band energy diagram taken across the FIG. 5 emitting region along the path AB after a voltage is applied to the device.

For the potential variation illustrated by the energy diagram of FIG. 6 to exist in the FIG. 3 structrue, it is necessary that an electric field internal to the emitting region 20 exist; this electric field being associated with a charge field. Analysis of the semicircular emitting region 20 shown in FIGS. 2 and 5 shows that with a voltage applied across the contacts 18 and 19, a charge field exists in the form of the altered depletion regions shown at 28 and 30 in FIG. 5 and that electric fields also exist in the emitting region 20 as illustrated by the vectors $F_1 - F_8$ in FIG. 3. It is notable that the configuration of the depletion regions shown in FIG. 5 differs sharply from the depletion regions associated with a conventional n-p-n transistor-like structure. In the transistor-like structure, charge neutrality across both the n-p junction and the p-n junction is strictly maintained if the bias voltage is not too large. The magnitudes of the negative and positive charges associated with the forward biased junction (n-p) are reduced by equal amounts, and the magnitudes of the charges associated with the back or reversed biased junction (p-n) are increased by equal amounts. Thus charge neutrality is maintained across each individual junction as well as across both of the junctions.

As shown in FIG. 5, the depletion regions (or charge concentration) of the junction in the present invention are made asymmetrical by a redistribution of charge throughout the depletion regions so that the positive charge associated with point X has decreased while the negative charge has increased by the application of a bias voltage to the device. Thus, charge neutrality across the forward biased portion of the junction is violated. In like fashion, in the back biased portions of the junction (p-n) of the present device, as shown in FIG. 5, the depletion regions (or charge concentration) are made asymmetrical by the application of a bias voltage in that the positive charge associated with point Z is increased while the negative charge concentration decreases. These charge concentration asymmetries are such that although charge neutrality across the individual junction (forward or reversed biased) is violated, charge neutrality along any path such as A–O–B of FIG. 5, is maintained. At some point C located approximately halfway between the region of maximum charge asymmetry at X and Z, the charge concentrations are equal. Point C is thus the point dividing the forward and reversed biased regions of the junction.

The difference in the depletion region or charge concentration behavior in the normal n-p-n junction arrangement and the present invention device is attributed to the continuous nature of the depletion regions in the present invention device and to the continuous variation in the biasing of the junction due to the adjacent conduction path of the device as compared with the interrupted nature of the depletion regions of the normal n-p-n junction device and the discontinuous bias conditions. That is, the positive charge outer depletion region 30 in FIG. 5 is continuous all around the interface 22 from the point X to the point Z without being interrupted by omission of the bottom part of the interface (the portion containing the point Y for instance). The depletion regions 28 and 30 in the FIG. 5 device are also made continuous and free of intersection by the depletion regions 34 formed around the contact electrodes 18 and 19 when voltage is applied to the device. That is, the electrodes 18 and 19 are separated from the emitting region 20 by a relatively large distance so that the depletion regions 34 do not intersect with the depletion regions 28 and 30.

The electric field internal to the tin monoxide emitting region 20 resulting from the asymmetrical charge distributions illustrated in FIG. 5, is represented by the family of vectors $F_1 - F_8$ shown in FIG. 3. This family of vectors represents the magnitude and direction of force exerted on a unit negative charge by the asymmetrical charge distributions in the two depletion regions 28 and 30. As illustrated in FIG. 3, the internal electric field is sufficiently small that "band bending" or a significant variation in the Fermi level in the tin monoxide material does not occur.

The electric field represented by the vectors $F_1 - F_8$, has its maximum amplitude along the horizontal vectors $F_1$ and $F_8$ which are coincident with the surface 25 in FIG. 3, and has its minimum value at a null vector (not shown) which is of zero length and located parallel to the reference plane P at the pont O' in FIG. 3. The magnitude of the individual vectors in the family $F_1 - F_8$ is determined by the relation:

$$|\text{Electric Field}| \sim \int Q \, dr$$

where $Q$ represents electric charge, and $r$ represents the distance along the path starting at some point of zero charge outside the region 20 and ending at the point O'.

Since the horizontal electric field vector $F_1$ in FIG. 3 has the maximum magnitude but a zero vertical compolent, and since the zero length or null electric field vector has the maximum vertical component but has zero magnitude, there is a vector located between the vectors $F_1$ and the null vector which will have a maximum vertical component and will hence be the most effective to accelerate electrons to overcome the surface barrier denoted by the line 40 in FIG. 6 so that electron will be emitted from the surface 25.

The direction of maximum electron emission from the surface 25 is defined by a combination of the electric field vector having a maximum vertical component and also by the magnitude of electron flow across the interface 22. The magnitude of electron flow over the interface barrier 22 is represented in FIG. 3 by the arrows $E_1$, $E_2$ and $E_3$. This flow being a maximum at $E_1$ due to the maximum reduction in charge density in depletion region 30 at point X reducing to zero at point C($E_3$). The electron flow is zero at point C since as noted before, this is a point of zero bias.

The interaction of the field vectors and the variation of the number of electrons crossing the interface barrier gives a preferential direction to the electron emitted into the vacuum. This preferential direction is indicated in FIG. 3 by line 51. The arrows $E_1 - E_3$ represent the electron flow from all mechanisms such thermionic, tunneling, etc., by which charge carriers can cross a barrier.

The net difference in electrons flowing into the emitting region 20, represented by the family $E_1 - E_2$, and the electrons flowing out of the emitting region 20, represented by the family $E_2 - E_3$, represents the electrons emitted from the surface 25 assuming recombination currents, etc., are zero.

The curve 53 in FIG. 3 represents the angular distribution of electrons emitted from the surface 25, the greatest number of electrons being at the peak of this curve along the arrow 51 with decreasing numbers being directed at angles slightly removed from this peak. As illustrated by the curve 53, the number of electrons emitted at a smaller angle than the arrow 51 with respect to the reference plane P decreases more rapidly than those directed at an angle greater than the arrow 51. The point O' on the surface 25 represents the point of maximum emission of electrons and is displaced by a very small distance from the geometric center O of the emitting region 20. This separation is shown greatly exaggerated in FIG. 3, and is the result of the asymmetrical charge distributions. The point O' shown in FIG. 3 is the point common to all electric field vectors $F_1 - F_8$, and the separation between O – O' increases with an increase in the voltage applied across the device.

The electrons crossing the interface barrier 22 are illustrated in FIG. 6 by the distribution 46. These electrons are shown as "hot" relative to the material of region 20. However, this is not important, since these electrons, as noted before, are due to many emission mechanisms such as thermionic, tunneling, etc., and the actual distribution is quite complex. Regardless of the initial distribution 46, the electron energy distribution will be essentially drifted Maxwellian at the surface barrier 40 and at the right (FIG. 6) interface barrier 52. This Maxwellian distribution at the barrier 52 is represented by the distribution 48, and the line 49 represents the average electron energy. The distribution 48 is controlled by the internal electric field due to the voltage applied across the device. In particular, the electron's average energy line 49 is controlled relative to both the surface barrier 40 and the interface barrier 52 by the application of the voltage $V_1$ across the contacts 18 and 19.

Electron emission from the surface occurs when the electrons in the emitting region 20 have acquired sufficient energy from the internal electric field to overcome the surface barrier 40. The curvature of the generally cylindrical interface 22 effectively concentrates the electron flow towards the center O' of the region 20 so that the electrons are primarily emitted from a centralized portion of the region.

As illustrated in FIG. 5, the thickness T of the film-like body 16 is made somewhat greater than radius R of the cylindrical region 20 so that the outer depletion region 30 is continuous and uninterrupted around the interface 22. Preferably, the radius R should be between .1 and 1 micron and should not be greater than three-fourths of the body thickness T at the reference plane P. If the body thickness T is increased at the reference plane P to a value substantially greater than the radius R, the resulting greater cross-sectional area in the throat region of the conduction path 50 effectively reduces the electric field in the emitting region 20, and results in an electron emitting device having a higher threshold voltage and lower efficiency as an emitter. It is also found that the threshold voltage increases as the radius R increases. As a maximum practical limit, the radius R should not exceed 25 microns. It is also important for the contacts 18 and 19 to be spaced at a sufficient distance from the junction 20 so that their corresponding depletion regions 34 do not intersect with the outer depletion region 30 surrounding the interface 22.

In fabricating the electron emitting device shown in FIGS. 1 and 2, it is preferable to deposit chemically a tin dioxide film on a quartz substrate until the film has a thickness approximately twice the desired value of the radius R. For optimum performance, the film thickness should be less than one micron. After deposition, the film is placed in a reducing atmosphere and is electrically heated by applying a voltage of about ten volts across the contacts 18 and 19. While current from this ten volts is flowing through the film, the current is monitored and the voltage is slowly increased until, without a further increase in voltage, the current continues to rise and then suddenly drops to about one tenth of the value before the current continued to rise without a voltage increase. The sharp drop in the current flow indicates a corresponding sharp increase in the resistance of the film. This rapid increase in resistance results from the formation of the region 20 within the narrow constricted portion 17 of the body 16. The voltage is shut off immediately after the sharp drop in the current.

As mentioned above, the electron emitting device is illustrated in the form of a tin dioxide - tin monoxide heterojunction. However, the emitting device may be formed of other semiconductor materials and by other fabrication techniques, providing the general geometry and configuration of the region 20 are maintained in relation to the body 16. It is also possible to form the electron emitting region 20 from a metal in place of the narrow band type semiconducting material.

Figure 7:
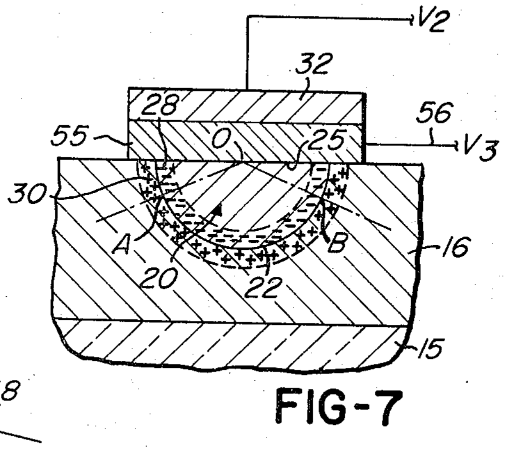
FIG. 7 is a fragmentary view similar to FIG. 2 and illustrating the application of the device for emitting electrons directly into a solid semiconductor in accordance with another embodiment of the invention.

While the emitting device disclosed in FIGS. 1–6 relates to the emission of electrons from the surface 25, the described device may also be used for emitting or ejecting electrons directly into another solid. Thus referring to FIG. 7, the emitting surface 25 of the junction 20 is located adjacent another film-like element 55 of a semiconductor material which receives a controlled charge through a lead 56 which is connected to a voltage source $V_3$. In FIG. 7, the metallic electron collector 32 is located adjacent the other side of the semiconductor element 55 forming by way of illustration a Schottky barrier between the element 55 and the collector 32. Thus the emission of electrons from the region 20 cannot only be controlled or varied by changing the voltage across the contacts 18 and 19 and/or on the collector 32, but may also be controlled by changing the voltage $V_3$ on the element 55. At the present time, the specific applications of this embodiment for emitting electrons directly into another solid are not certain. However, it is believed that this embodiment will be useful in construction of improved injection lasers, new and improved acusto-electric and transferred electron devices, as well as variable barrier transistors and similar electronic components. It is also to be understood that in the FIG. 7 embodiment of the invention, the emitter may be constructed so that holes form the majority current carriers instead of electrons.

While the emitting device disclosed in FIGS. 1–6 relates to a device having a body 16 fabricated with a wide band gap n-type semi-conductor, an emitting device may also be fabricated in accordance with the invention by using narrow band gap, either n-type or p-type, semiconductor materials. Emitting devices using p-type material for the body 16 are particularly important in the embodiment disclosed in FIG. 7 and for photo-sensitive electron emitting devices.

As mentioned above, the emitting device of the present invention may be chemically formed by locally heating the film-like body portion which is to form the electron emitting region in a reducing atmosphere as specified. A solid state emitter device may also be fabricated by other techniques depending on the materials selected for both the body 16 and the region 20. Usually the semiconductor body 16 of the solid state emitter is fabricated by using standard techniques such as chemical vapor deposition or epitaxial formation. Preferably, the body is then annealed, especially if the semiconductor material is one that exists in more than one chemical combination, e.g., $A_xB_y$ or $A_xB_{y-n}$, such as some of the oxides and chlorides. By annealing in the presence of a suitable oxidation or reducing agent, the semiconductor properties can be controlled.

In addition to chemical formation of the region 20 by electrically heating the body 16, this region may also be formed by etching a small region of the semiconductor body 16 to form a generally V-shaped trough or groove in the upper surface 21 of the semiconductor body 16. The region 20 material, which may be either a semiconductor or a metal, is then deposited in the etched groove by a method such as vapor deposition or sputtering. The region 20 may also be formed by ion implantation of the region 20 material, using conventional implantation techniques.

From the drawing and the above description, it is apparent that a cold solid state electronic emitting device constructed in accordance with the invention, provides desirable features and advantages. For example, the emitting region 20 is constructed so that the interface 22 is generally semicircular in cross-section or at least a substantial portion of the interface is neither parallel nor perpendicular to the reference plane P of the emitting region. In addition, the emitting region does not extend through the body 16 so that continuous inner and outer depletion regions 28 and 30 border the interface 22. As a result of this junction geometry and configuration, an electric field is created within the region 20 when a voltage is applied across the body 16 in a lateral direction normal to the reference plane P. This internal electric field within the region 20 produces "hot" electrons within the region so that the emission of electrons from the surface 25 is directly proportional to the voltage drop across the throat region of the conductor path 50 and inversely proportional to the radius R of the junction 20. Thus, the size of the junction should be minimized so that electric field strengths near the $10^6$ volts per centimeter believed desirable for electron emission from the tin oxide semiconductor materials, will be attained with reasonably low voltages applied across the contact electrodes 18 and 19.

Furthermore, the electron emitting device of the present invention does not require a good vacuum; it also provides for a long service life since it has no life limiting mechanisms other than heat. All prior art cold cathode emitters have at least one life limiting mechanism in addition to heat. The emitter of the present invention also provides a high emission efficiency, at least up to 50 percent, and will operate in a wide range of temperatures such as between 20° K and 700° K. As mentioned above, the body 16 may be formed of other semiconductor materials such as p-type semiconductor material. The heterojunction interface 22 described above in this specification provides for minimizing the voltage drop required across the region 20 to produce the electric fields within the junction necessary for emission.

As also mentioned above, the described configuration of the heterojunction interface 22 insures that the fields within the junction 20 have components parallel to the reference plane P of the junction, these components are essential to assure emission of electrons from the surface 25. The depth of the region 20 relative to the thickness of the film or body T at the reference plan P is also important. As mentioned above, the thickness T of the body 16 should be at least equal to the depth or radius R of the interface 22 plus the width of the outer depletion region 30 to assure that the depletion regions 28 and 30 are continuous along the interface 22. However, it is desirable to minimize the film thickness so that the current by-passing the junction is minimized.

As also indicated above, there are numerous applications for electron emitting devices constructed in accordance with the invention. For example, one application is in the construction of photo cathodes for use in infrared or near infrared imaging devices. The emitting device is also adaptable for producing electron beam injection transistors and RF amplifiers and self oscillating RF oscillators as commonly used in radar and radio applications. Additional applications of the device are in the production of transferred electron devices and various instruments such as electron emitters used in electronic equipment adapted for outer space exploration. The emitting device of the invention may also be adapted for other instruments such as electron beam computer memories where low vacuum operation is desirable, and for beam readout devices such as for scanning a screen which is sensitive to infrared radiation.

While the forms of solid state electron emitters and the methods of making the same herein described, constitute particular embodiments of the invention, it is to be understood that the invention is not limited to these precise forms of emitters and methods, and that changes may be made therein without departing from the scope and spirit of the invention.

The invention having thus been described, the following is claimed:

1. A solid state electron emitting device comprising a substrate, a film body of wide band gap semiconducting material on said substrate and having an outer surface, an emitting region projecting substantially into said body from said outer surface and comprising a narrow band gap semiconducting material having a resistivity higher than that of said film body material, said emitting region having an emitting surface interrupting said outer surface of said body, contact means on said body for applying a voltage across said emitting region in a direction normal to a reference plane extending through the center of said emitting region normal to said outer surface, and said body and said emitting region defining a heterojunction interface extending from said outer surface and having a substantial portion disposed at an acute angle relative to said reference plane to produce a current flow within said emitting region towards said emitting surface and a continuous emission of electrons from said emitting surface generally parallel to said reference plane in response to the application of the voltage across said contact means.

2. An emitting device as defined in claim 1 wherein said emitting region is generally semicircular in transverse cross-section.

3. An emitting device as defined in claim 1 wherein said emitting region is generally semicylindrical.

4. An emitting device as defined in claim 1 wherein the majority of said current carriers comprise electrons.

5. An emitting device as defined in claim 1 wherein the majority of said current carriers comprise holes.

6. An electron emitting device as defined in claim 1 including a charge carrier collector element of semiconducting material adjacent said emitting surface of said junction.

7. An electron emitting device as defined in claim 1 wherein said emitting region has a width in a direction normal to said reference plane of not greater than two microns.

8. A solid state electron emitting device comprising a substrate, a film body comprising a tin dioxide material on said substrate and having an outer surface, an emitting region projecting substantially into said body from said outer surface and comprising a tin monoxide material having a resistivity higher than that of said tin dioxide material, said emitting region having an emitting surface interrupting said outer surface of said body, contact means on said body for applying a voltage across said emitting region in a direction normal to a reference plane extending through the center of said emitting region normal to said outer surface, said emitting region has a width in a direction normal to said reference plane of not greater than two microns, and said body and said emitting region defining a heterojunction interface extending from said outer surface and having a substantial portion disposed at an acute angle relative to said reference plane to produce a current flow towards said emitting surface and a continuous emission of electrons from said emitting surface generally parallel to said reference plane in response to the application of the voltage across said contact means.

9. A method of making a solid state charge carrier emitting device, comprising the steps of forming a film body of semiconducting material on a substrate, forming an emitting region within the outer surface of said body with a semiconducting material having a resistivity higher than that of said film body material, said body and emitting region defining a heterojunction interface having a substantial portion extending from said outer surface at an acute angle relative to a reference plane extending through the center of the emitting region normal to said outer surface, and forming contact means on said body on opposite sides of said reference plane for applying a voltage across said emitting region to create within said emitting region internal electric field components parallel to said reference plane and continued emission of charge carriers from said emitting region generally parallel to said plane.

10. A method as defined in claim 9 wherein said interface is formed by etching a groove within said outer surface of said body, and said emitting region is formed by depositing the corresponding semiconducting material within said groove.

11. A method as defined in claim 9 wherein said interface and emitting region are formed by controlled ion implantation within said outer surface of said body.

12. A method as defined in claim 9 wherein said emitting region is formed by controlled localized resistance heating of said body within a reducing atmosphere.

13. A method as defined in claim 9 wherein said emitting region is formed having a width in a direction normal to said reference plane of not greater than two microns.

* * * * *